US006933784B2

(12) United States Patent
Alenin

(10) Patent No.: US 6,933,784 B2
(45) Date of Patent: Aug. 23, 2005

(54) OUTPUT STAGE FOR HIGH GAIN AND LOW DISTORTION OPERATIONAL AMPLIFIER

(75) Inventor: Sergey Alenin, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/725,358

(22) Filed: Dec. 1, 2003

(65) Prior Publication Data

US 2005/0093632 A1    May 5, 2005

Related U.S. Application Data

(60) Provisional application No. 60/517,436, filed on Nov. 5, 2003.

(51) Int. Cl.[7] .................................................. H03F 3/18
(52) U.S. Cl. ...................... 330/264; 330/265; 330/267; 330/257
(58) Field of Search .............................. 330/257, 264, 330/265, 267

(56) References Cited

U.S. PATENT DOCUMENTS

| 4,419,631 | A | * | 12/1983 | Bertails et al. | ............. | 330/255 |
| 5,621,357 | A | * | 4/1997 | Botti et al. | ................. | 330/253 |
| 5,900,783 | A | | 5/1999 | Dasgupta | .................... | 330/264 |
| 6,121,839 | A | | 9/2000 | Giacomini | .................. | 330/264 |
| 6,166,603 | A | | 12/2000 | Smith | ......................... | 330/263 |
| 6,218,900 | B1 | * | 4/2001 | Nolan | ........................ | 330/255 |
| 6,353,363 | B1 | | 3/2002 | Stockstad | .................. | 330/264 |
| 6,366,169 | B1 | * | 4/2002 | Ivanov | ....................... | 330/255 |

OTHER PUBLICATIONS

A Quad CMOS Single-Supply Op Amp with Rail-to-Rail Output Swing, Dennis M. Monticelli, 1986 IEEE.
LM112/LM212/LM312 Operational Amplifiers; 1995 National Semiconductor Corporation.

* cited by examiner

*Primary Examiner*—Patricia Nguyen
(74) *Attorney, Agent, or Firm*—W. Daniel Swayze, Jr.; W. James Brady; Frederick J. Telecky, Jr.

(57) ABSTRACT

A class-AB MOS output stage that provides higher gain and significantly lower distortion. The class-AB MOS output stage includes a PMOS output transistor and an NMOS output transistor coupled between positive and negative supply voltages such that the MOS output transistors operate in a common source mode, a first biased class-AB control circuit coupled between the output transistor gates, a first current source coupled between the gate of the PMOS output transistor and the positive supply, a second biased class-AB control circuit, and a second current source coupled between the second control circuit and the positive supply. The second class-AB control circuit is coupled between the second current source and a non-inverting input of the output stage. The gate of the NMOS output transistor is employed as the inverting input of the output stage, which further includes two differential amplifiers for controlling the first and second current sources. The class-AB MOS output stage has a fully symmetrical differential input-to-single-ended output circuit configuration, which allows corresponding sources of gain reduction and non-linearity to cancel out, thereby improving the performance of the output stage.

14 Claims, 6 Drawing Sheets

US 6,933,784 B2

OUTPUT STAGE FOR HIGH GAIN AND LOW DISTORTION OPERATIONAL AMPLIFIER

CROSS REFERENCE TO RELATED APPLICATIONS

This application claims priority of U.S. Provisional Patent Application Ser. No. 60/517,436, filed Nov. 5, 2003 entitled OUTPUT STAGE FOR HIGH GAIN AND LOW DISTORTION OPERATIONAL AMPLIFIER.

STATEMENT REGARDING FEDERALLY SPONSORED RESEARCH OR DEVELOPMENT

N/A

BACKGROUND OF THE INVENTION

The present application relates generally to operational amplifiers, and more specifically to output stages of MOS operational amplifiers.

Metal Oxide Semiconductor (MOS) operational amplifiers (op amps) are known that employ output stages of the class-AB type to achieve good output current capability. For example, a conventional class-AB MOS output stage may include a p-channel MOS (PMOS) output transistor and an n-channel MOS (NMOS) output transistor operating in a common source mode, a biased class-AB control circuit coupled between the gates of the PMOS and NMOS output transistors, and a current source coupled between the gate of the PMOS output transistor and a positive power supply. In this configuration, the gate of the NMOS output transistor is employed as an inverting input, and a common source connection of the output transistors is employed as an output of the output stage. In the event the conventional class-AB MOS output stage is driven by a differential stage providing differential outputs, the current source may be replaced by a current mirror, and the input of the current mirror may serve as the non-inverting input of the output stage.

Although the conventional class-AB MOS output stage described above generates sufficient output current for many applications, the MOS output stage has drawbacks. For example, the gain of an MOS op amp including the MOS output stage is typically limited by a number of factors such as (1) the output conductance of the input signal current source, (2) the output conductance of the current mirror, and (3) the impact ionization phenomenon, which generally causes leakage currents to be generated in MOS transistors operating under high drain-bulk voltages. Such impact ionization can cause unwanted parasitic conductance at the high impedance gates of the MOS output transistors.

Another drawback of the conventional class-AB MOS output stage is that it often generates a significant amount of distortion, i.e., its output is frequently non-linear. Like the gain limitations of MOS op amps incorporating the conventional MOS output stage, the non-linearity of the output stage also results from a number of factors. First, the output voltage of the MOS output stage is typically a non-linear function of the gate voltages of the respective PMOS and NMOS output transistors. Because of these non-linear gate voltages and the parasitic conductance of the high impedance gate nodes, a non-linear current is often required at the input of the output stage to offset the non-linear output. Further, there is typically significant non-linear parasitic capacitance at the high impedance gates of the output transistors. Such non-linear parasitic capacitance can be exacerbated by the parasitic capacitance of (1) the input signal current source, (2) the class-AB control circuit, and (3) the current mirror included in the output stage.

One way of canceling at least a portion of the parasitic conductance found in the conventional class-AB MOS output stage is to employ a current mirror with tracking feedback. However, although tracking feedback may be effective in canceling the output conductance of the current mirror, it has essentially no beneficial impact on the output conductance of the input signal current source and the non-linear parasitic conductance/capacitance of the output transistor gates.

Still another drawback of the conventional class-AB MOS output stage is that the circuitry for biasing the class-AB control circuit typically fails to provide for stable quiescent currents at the MOS output transistors, especially when short channel output devices are employed for high speed, high current applications.

It would therefore be desirable to have an output stage for an op amp that provides for higher gain and reduced distortion, while avoiding the drawbacks of the above-described conventional op amp output stages.

BRIEF SUMMARY OF THE INVENTION

In accordance with the present invention, a class-AB output stage for an operational amplifier (op amp) is disclosed that provides higher gain and significantly lower distortion than conventional output stages. The presently disclosed class-AB output stage achieves such benefits by effectively canceling the sources of gain reduction and non-linearity in the output circuit.

In one embodiment, the class-AB output stage includes a p-channel MOS (PMOS) output transistor and an n-channel MOS (NMOS) output transistor coupled between a positive power supply and a negative power supply such that the MOS output transistors operate in a common source mode, a first biased class-AB control circuit coupled between the gates of the output transistors, a first current source coupled between the gate of the PMOS output transistor and the positive power supply, a second biased class-AB control circuit, and a second current source coupled between the second class-AB control circuit and the positive power supply. The second class-AB control circuit is coupled between the second current source and a non-inverting input of the MOS output stage. In the presently disclosed embodiment, an inverting input of the MOS output stage is provided at the gate of the NMOS output transistor, and an output of the MOS output stage is provided at the common source connection of the MOS output transistors. Further, the first and second current sources are configured to operate as a current mirror. In addition, the class-AB MOS output stage includes two differential amplifiers configured to control the first and second current sources by closing a local negative feedback path around the current mirror and employing tracking feedback. A line of symmetry may be conceptually drawn between the non-inverting and inverting inputs, between the first and second class-AB control circuits, and between the first and second current sources of the class-AB MOS output stage.

By providing the class-AB MOS output stage with a fully symmetrical differential input-to-single-ended output circuit configuration, corresponding sources of gain reduction and non-linearity on each side of the symmetry line can be made to cancel one another, thereby significantly improving the performance of the output stage.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

U.S. Provisional Patent Application No. 60/517,436 filed Nov. 5, 2003 entitled OUTPUT STAGE FOR HIGH GAIN AND LOW DISTORTION OPERATIONAL AMPLIFIER is incorporated herein by reference.

A class-AB output stage is disclosed that provides both increased gain and reduced distortion. Benefits of the presently disclosed class-AB output stage are achieved by providing a fully symmetrical differential input-to-single-ended output circuit configuration, in which corresponding sources of gain reduction and non-linearity on each side of a symmetry line conceptually drawn on the circuit effectively cancel one another.

Figure 1:
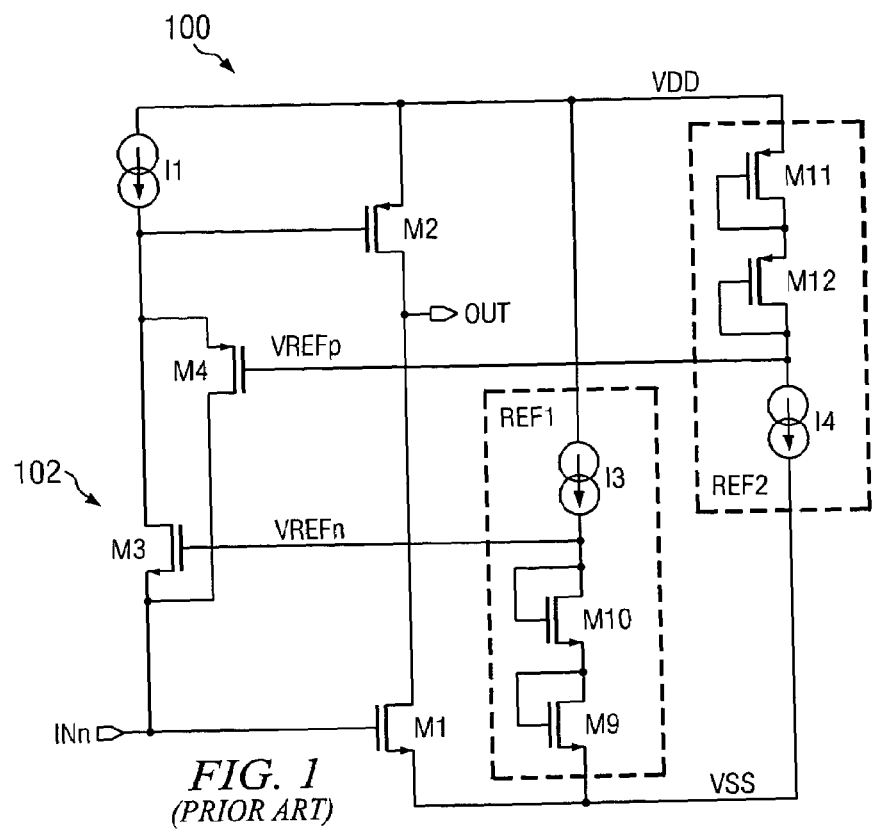
FIG. 1 is a schematic diagram of a conventional class-AB MOS output stage.

FIG. 1 depicts a conventional class-AB MOS output stage 100, as disclosed in the IEEE Journal of Solid State Circuits, vol. SC-21, December 1986, pages 1026–1034, which is incorporated herein by reference. For example, the class-AB MOS output stage 100 may be employed in any suitable Metal Oxide Semiconductor (MOS) operational amplifier (op amp) for good output current capability. As shown in FIG. 1, the conventional MOS output stage 100 includes an n-channel MOS (NMOS) output transistor M1 and a p-channel MOS (PMOS) output transistor M2 coupled between positive and negative power supplies VDD and VSS. The sources of the output transistors M1–M2 are connected to one another, and the output OUT of the MOS output stage is provided at the common source connection of the transistors M1–M2. The MOS output stage 100 further includes a class-AB control circuit 102 coupled between the gates of the output transistors M1–M2, and a current source 11 coupled between the gate of the output transistor M2 and the positive power supply VDD. The class-AB control circuit 102 includes an NMOS transistor M3 and a PMOS transistor M4 biased by reference voltages VREFn and VREFp, respectively. The reference voltages VREFn and VREFp are applied to the gates of the transistors M3–M4 by bias generators REF1–REF2, respectively. It is noted that the connection of the drain of the transistor M3, the source of the transistor M4, and the gate of the transistor M1 serves as an inverting input INn of the MOS output stage 100.

Specifically, the bias generator REF1 includes a current source 13 connected in series with a pair of diode-connected NMOS transistors M9–M10. The reference voltage output VREFn is provided at the connection between the current source 13 and the transistor M10. The bias generator REF2 includes a current source 14 connected in series with a pair of diode-connected PMOS transistors M11–M12. The reference voltage output VREFp is provided at the connection between the current source 14 and the transistor M12. In the illustrated embodiment, the reference voltage VREFn is equal to VSS+2Vgs, in which Vgs is the voltage between the gate and the source of the respective diode-connected transistors M9–M10. Similarly, the reference voltage VREFp is equal to VDD−2Vgs, in which Vgs is the voltage between the gate and the source of the respective diode-connected transistors M11–M12.

As described above, the conventional class-AB MOS output stage 100 has a single input, i.e., the inverting input INn, and is therefore suitable for being driven by an op amp input stage (not shown) having a single-ended output. In the event the op amp input stage has a differential output, the class-AB MOS output stage may be modified to include both inverting and non-inverting inputs.

Figure 2:
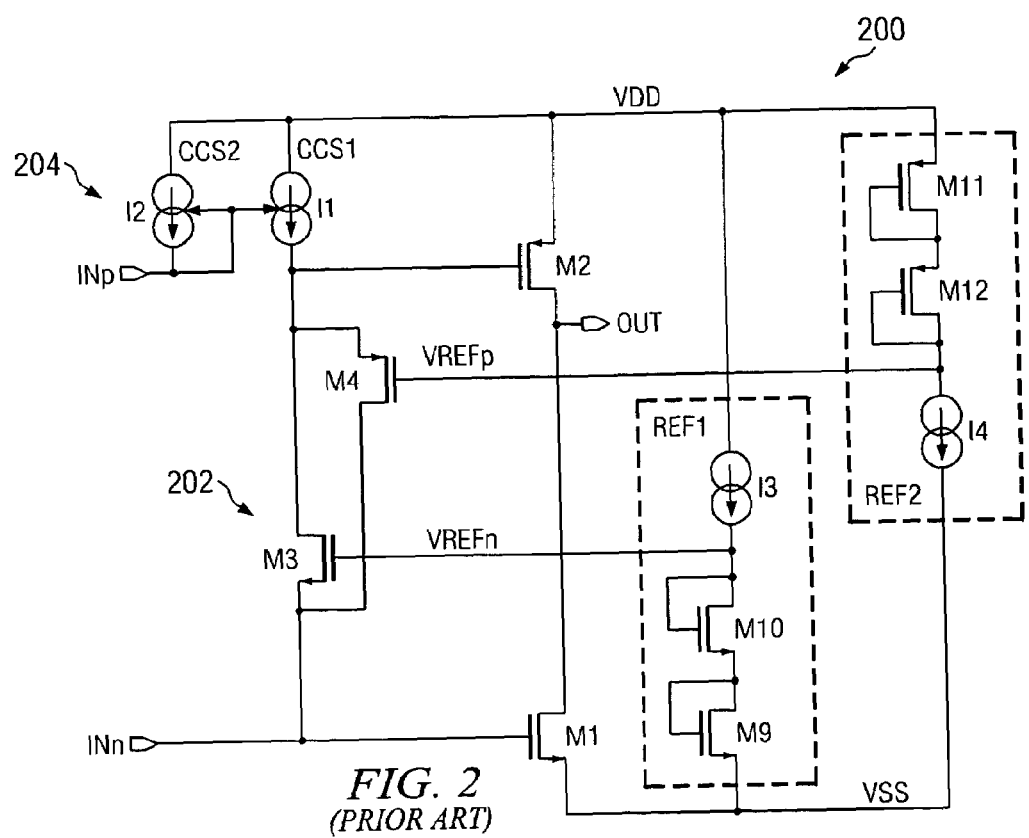
FIG. 2 is a schematic diagram of the class-AB MOS output stage of FIG. 1 including differential inputs.

FIG. 2 depicts a conventional class-AB MOS output stage 200 having an inverting input INn and a non-inverting input INp. As shown in FIG. 2, the class-AB MOS output stage 200 includes MOS output transistors M1–M2, a class-AB control circuit 202, and bias generators REF1–REF2. The class-AB MOS output stage 200 is like the class-AB MOS output stage 100 (see FIG. 1) with the exception that the current source 11 of the output stage 100 is replaced by a current mirror 204 including controlled current sources CCS1–CCS2, thereby providing the non-inverting input INp at the input of the current mirror 204 (i.e., the output of the controlled current source CCS2).

Those of ordinary skill in this art will appreciate that the gain of an MOS op amp including the class-AB output stage 100 (see FIG. 1) or the class-AB output stage 200 (see FIG. 2) is typically limited by the output conductance of the input signal current source, and the impact ionization phenomenon, which generally causes leakage currents to be generated in MOS transistors operating under high drain-bulk voltages. Such impact ionization can cause unwanted parasitic conductance at the high impedance gates of the output transistors M1–M2. The op amp gain is further limited by the output conductance of the current mirror 204 (see FIG. 2).

In addition, the output of an MOS op amp including the class-AB output stage 100 or the class-AB output stage 200 often exhibits non-linearity due to the output voltage of the class-AB output stage being a non-linear function of the gate voltages of the MOS output transistors M1–M2, and the non-linear parasitic capacitance at the high impedance gates of the output transistors M1–M2. This non-linear parasitic capacitance may be exacerbated by the parasitic capacitance of the input signal current source, the class-AB control circuit, and the current mirror 204 of the output stage 200 (see FIG. 2).

Figure 3A:
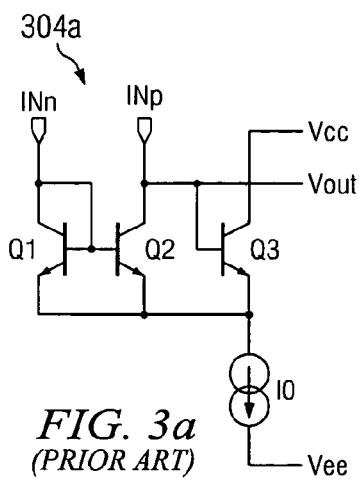
FIGS. 3a–3b are schematic diagrams of circuits that may be employed to implement tracking feedback in the class-AB MOS output stages of FIGS. 1–2.
Figure 3B:
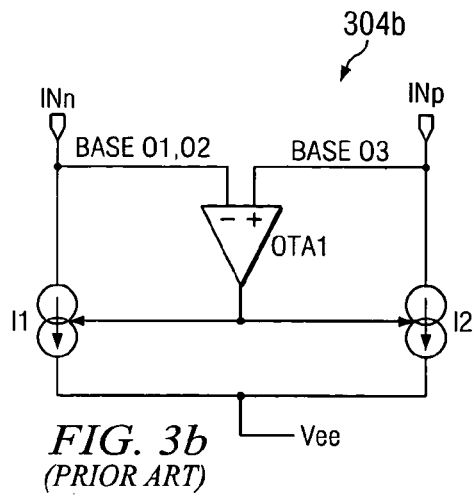

FIGS. 3a–3b depict conventional current mirrors 304a–304b, respectively, each of which may be used in place of the current mirror 204 included in the class-AB MOS output stage 200 (see FIG. 2). For example, the current mirror 304a is disclosed in the LM112/LM212/LM312 Operational Amplifier data sheet, page 5, copyright 1995, published by the National Semiconductor Corporation, Arlington, Tex., USA. Both of the current mirrors 304a–304b are configured with tracking feedback, which may be employed to cancel unwanted parasitic capacitance, asymmetry caused by the parasitic capacitance, etc. It is noted that the current mirror 304b (see FIG. 3b) is a generalization of the current mirror 304a (see FIG. 3a). Although the current mirrors 304a–304b may be employed in the class-AB MOS output stage 200 (see FIG. 2) to cancel the parasitic conductance contributed by the current mirror 204, the current mirrors 304a–304b are typically ineffective in canceling the output conductance of the input signal current source and the non-linear parasitic conductance/capacitance of the output transistor gates. It is further noted that the bias generators REF1–REF2 (see FIGS. 1–2) typically fail to provide for stable quiescent currents at the MOS output transistors M1–M2, especially when short channel output devices are employed in high speed, high current applications.

Figure 4:
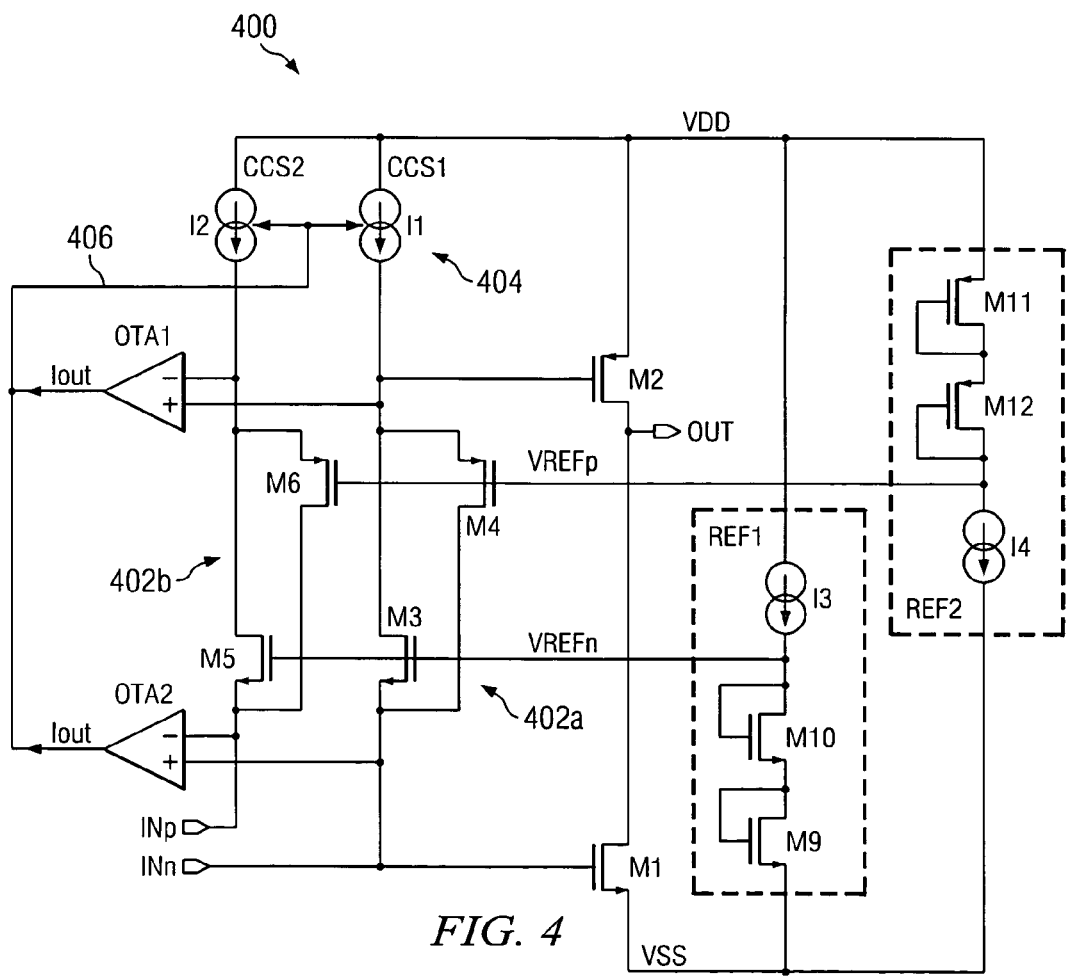
FIG. 4 is a schematic diagram of a class-AB MOS output stage according to the present invention.

FIG. 4 depicts an illustrative embodiment of a class-AB output stage 400, in accordance with the present invention. The class-AB output stage 400 has a symmetrical differential input-to-single-ended output circuit configuration that allows sources of gain reduction and non-linearity within the circuit to effectively cancel one another, thereby improving the overall performance of the output stage. For example, the class-AB output stage 400 may be incorporated into any suitable operational amplifier. It is understood that the class-AB output stage 400 may be implemented using MOS technology, bipolar technology, or any other suitable semiconductor technology. The class-AB output stage 400 is described herein as being implemented in MOS technology for purposes of illustration.

In the illustrated embodiment, the class-AB MOS output stage 400 comprises complementary NMOS and PMOS output transistors M1–M2 serially coupled between a positive power supply VDD and a negative power supply VSS. The single-ended output OUT of the MOS output stage 400 is provided at a common source connection of the NMOS and PMOS output transistors M1–M2. The MOS output stage 400 further comprises biased class-AB control circuits 402a–402b, a current mirror 404 including controlled current sources CCS1–CCS2, differential amplifiers OTA1–OTA2, and bias generators REF1–REF2.

As shown in FIG. 4, the class-AB control circuit 402a, which includes complementary NMOS and PMOS control transistors M3–M4, is coupled between the gates of the MOS output transistors M1–M2. Further, the class-AB control circuit 402b, which includes complementary NMOS and PMOS control transistors M5–M6, is coupled between the inverting inputs of the differential amplifiers OTA1–OTA2. The controlled current source CCS1 is coupled between the gate of the PMOS output transistor M2 and the positive power supply VDD, and the controlled current source CCS2 is coupled between the inverting input of the differential amplifier OTA1 and the power supply VDD. The inverting input INn of the MOS output stage 400 is provided at the connection of the gate of the NMOS output transistor M1, the drain of the NMOS transistor M3, the source of the PMOS transistor M4, and the non-inverting input of the differential amplifier OTA2. Further, the non-inverting input INp of the MOS output stage 400 is provided at the connection of the drain of the NMOS transistor M5, the source of the PMOS transistor M6, and the inverting input of the differential amplifier OTA2. The inverting and non-inverting inputs INn and INp define a pair of differential input signal lines of the MOS output stage 400.

The bias generator REF1 includes a current source 13 and a pair of diode-connected NMOS transistors M9–M10, and the bias generator REF2 includes a current source 14 and a pair of diode-connected PMOS transistors M11–M12. Further, the bias generator REF1 provides a reference voltage VREFn at the connection between the current source 13 and the transistor M10, and the bias generator REF2 provides a reference voltage VREFp at the connection between the current source 14 and the transistor M12. The reference voltage VREFn is applied to the gates of the NMOS transistors M3 and M5, and the reference voltage VREFp is applied to the gates of the PMOS transistors M4 and M6 to bias the class-AB control circuits 402a–402b. It is noted that a line of symmetry may be conceptually drawn between the inverting and non-inverting inputs INn and INp, between the class-AB control circuits 402a–402b, and between the controlled current sources CCS1–CCS2 of the class-AB MOS output stage 400.

It will be appreciated that differential parasitic currents within the presently disclosed class-AB MOS output stage 400 are significantly reduced by the class-AB control circuits 402a–402b and the differential amplifiers OTA1–OTA2. Specifically, the class-AB control circuits 402a–402b are operative to cancel the voltage differences between each pair of differential nodes within the MOS output stage 400, thereby converting differential parasitic currents into common mode currents, which are effectively suppressed by the symmetrical design of the output stage. Further, the differential amplifiers OTA1–OTA2, each of which provide current outputs Iout, are operative to close a local negative feedback around the current mirror 404 via the feedback path 406, thereby providing tracking feedback. It is noted that the differential amplifier OTA1 operates to keep the output voltages of the controlled current sources CCS1–CCS2 substantially equal, and the differential amplifier OTA2 operates to keep the input voltages INn and INp substantially equal under all operating conditions.

Figure 5:
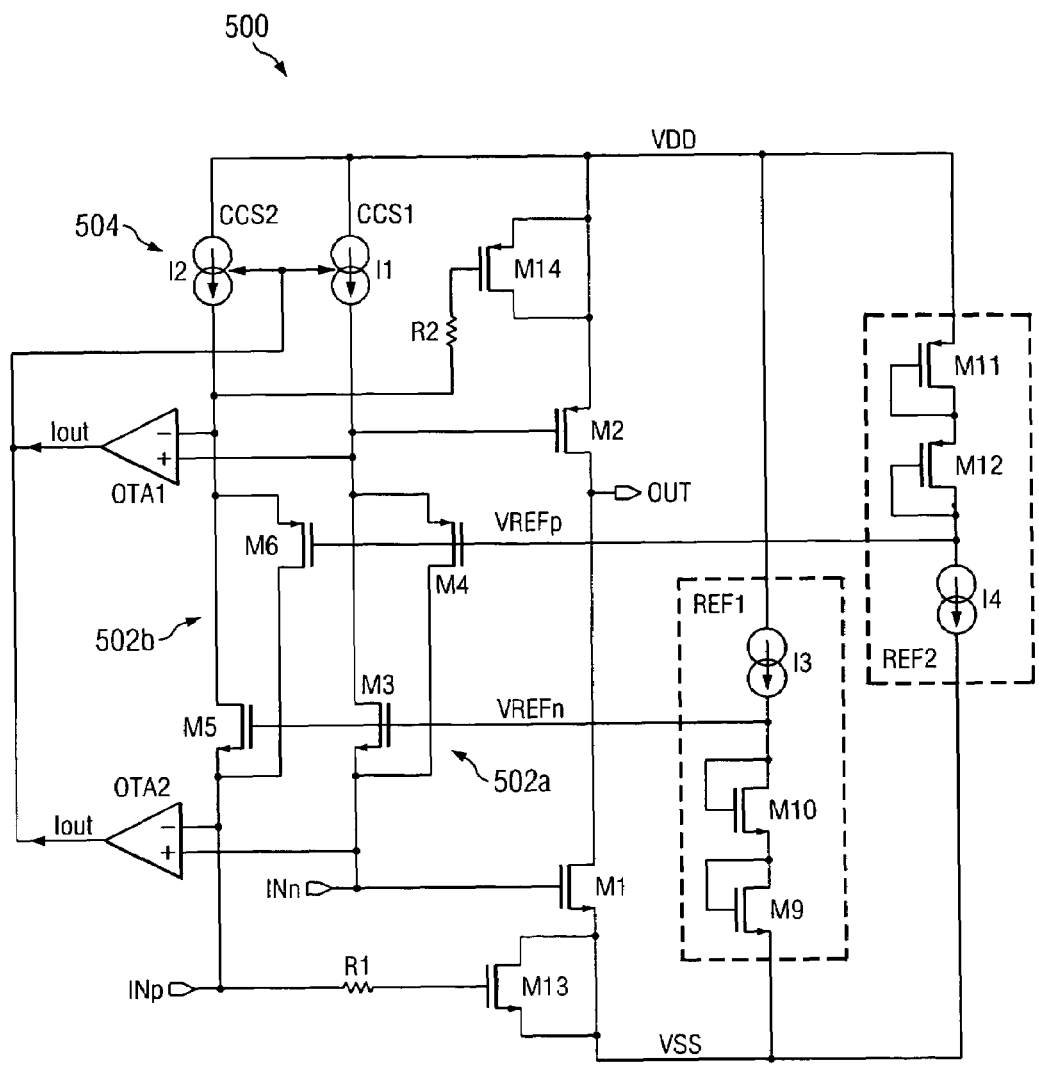
FIG. 5 is a schematic diagram of the class-AB MOS output stage of FIG. 4 modified to eliminate asymmetry caused by gate parasitic capacitance.

FIG. 5 depicts a first alternative embodiment 500 of the class-AB MOS output stage 400 (see FIG. 4). Like the MOS output stage 400, the class-AB MOS output stage 500 comprises inverting and non-inverting inputs INn and INp, NMOS and PMOS output transistors M1–M2 providing an output OUT at their common source connection, biased class-AB control circuits 502a–502b, a current mirror 504 including controlled current sources CCS1–CCS2, differential amplifiers OTA1–OTA2, and bias generators REF1–REF2. Accordingly, a line of symmetry may be conceptually drawn between the inverting and non-inverting inputs INn and INp, between the class-AB control circuits 502a–502b, and between the controlled current sources CCS1–CCS2 of the class-AB MOS output stage 500.

The class-AB MOS output stage 500 is operative to significantly reduce asymmetry caused by the gate parasitic capacitance of the MOS output transistors M1–M2. To that end, the class-AB MOS output stage 500 includes an NMOS transistor M13 and a PMOS transistor M14 having gate parasitic capacitance substantially equal to that of the output transistors M1–M2, respectively. As shown in FIG. 5, the source and the drain of the NMOS transistor M13 is connected to the drain of the output transistor M1, and the source and the drain of the NMOS transistor M14 is connected to the drain of the output transistor M2. Further, the gate of the NMOS transistor M13 is connected to the source of the PMOS transistor M6 through a resistor R1, and the gate of the PMOS transistor M14 is connected to the source of the NMOS transistor M5 through a resistor R2. The resistors R1–R2 are operative to prevent instability of the local feedback loop by separating the gate parasitic capacitance of the MOS transistors M13–M14 at high frequency.

Figure 6:
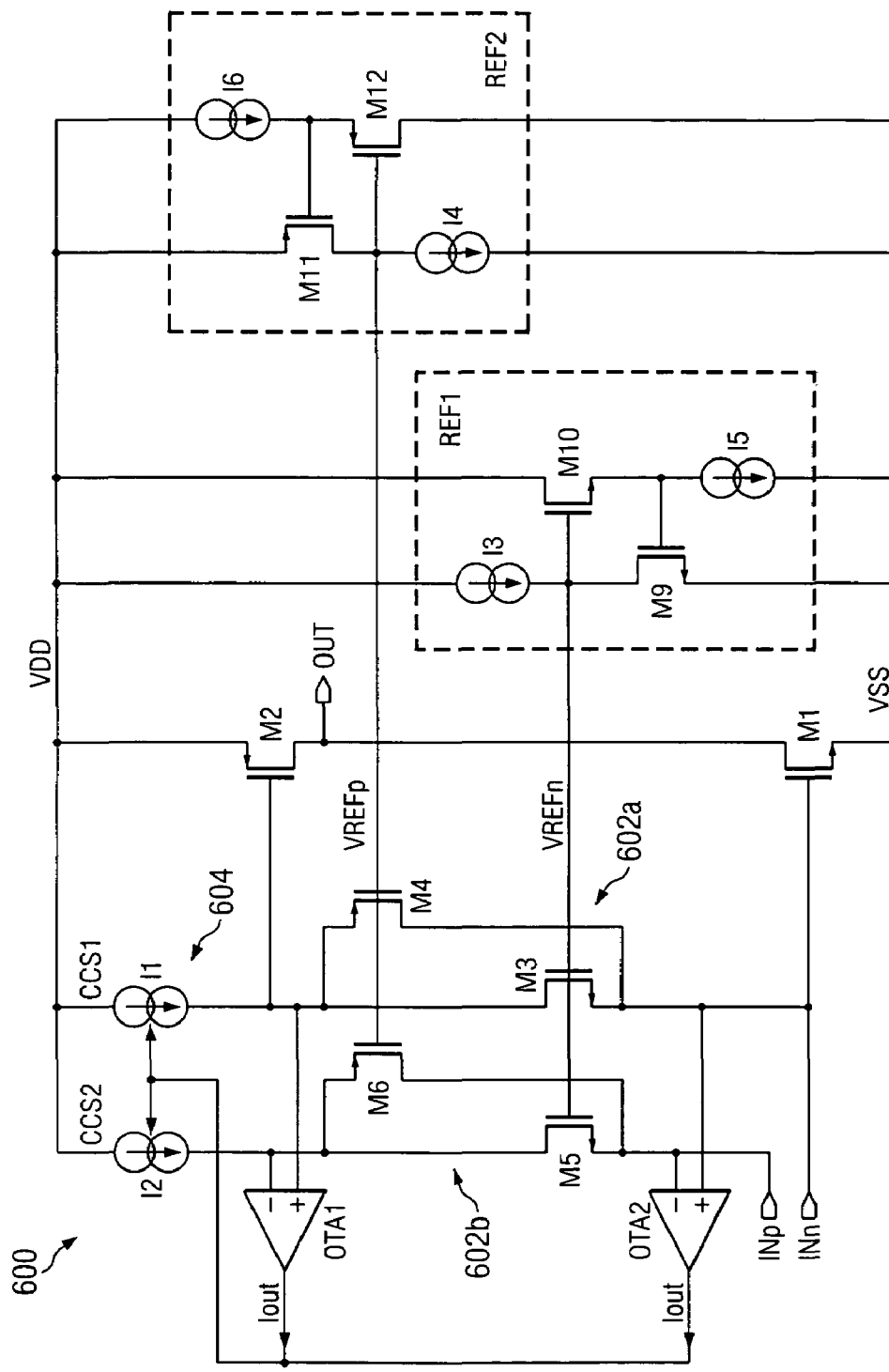
FIG. 6 is a schematic diagram of the class-AB MOS output stage of FIG. 4 modified to improve quiescent current stability.

FIG. 6 depicts a second alternative embodiment 600 of the class-AB MOS output stage 400 (see FIG. 4). Like the embodiments described above, the class-AB MOS output stage 600 comprises inverting and non-inverting inputs INn and INp, NMOS and PMOS output transistors M1–M2 providing an output OUT at their common drain connection, biased class-AB control circuits 602a–602b, a current mirror 604 including controlled current sources CCS1–CCS2, differential amplifiers OTA1–OTA2, and bias generators REF1–REF2 producing voltage references VREFn and VREFp. Accordingly, a line of symmetry may be conceptually drawn between the inverting and non-inverting inputs INn and INp, between the class-AB control circuits 602a–602b, and between the controlled current sources CCS1–CCS2 of the class-AB MOS output stage 600.

The class-AB MOS output stage 600 is operative to provide improved quiescent current stability over power supply voltage. To that end, the bias generator REF1 includes NMOS transistors M9–M10 and current sources 13 and IS, and the bias generator REF2 includes PMOS transistors M11–M12 and current sources 14 and 16, as shown in FIG. 6. The voltage between the gate and the source (Vgs) of the NMOS transistor M10 is approximately equal to the voltage Vgs of the NMOS transistor M3, thereby making the voltage Vgs of the output transistor M1 more stable over power supply voltage. Similarly, the voltage Vgs of the PMOS transistor M12 is approximately equal to the voltage Vgs of the PMOS transistor M4 to make the voltage Vgs of the output transistor M2 more stable over power supply voltage.

Figure 7:
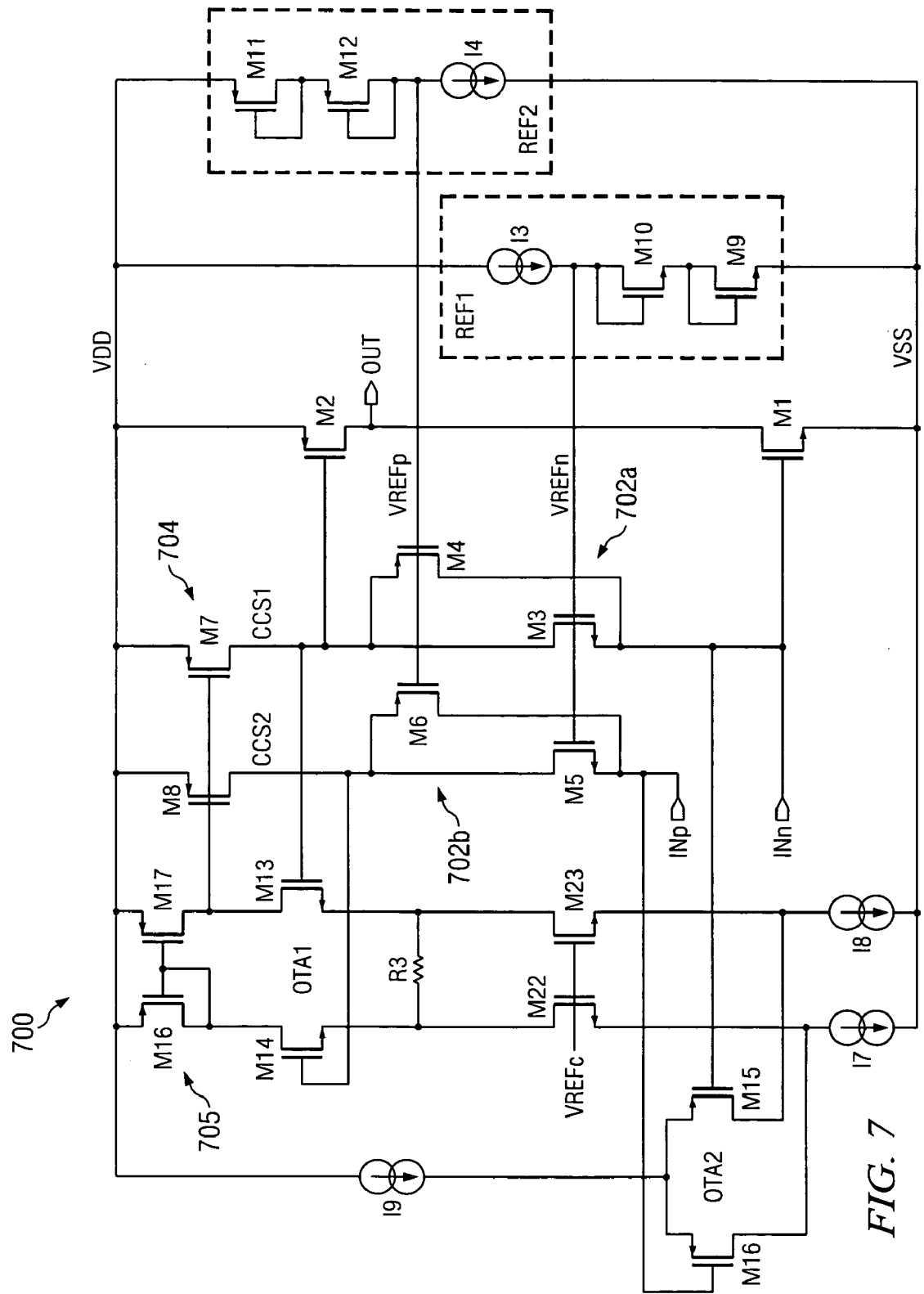
FIG. 7 is a schematic diagram of a detailed view of the class-AB MOS output stage of FIG. 4 at the transistor level.

FIG. 7 depicts the preferred embodiment 700 of the class-AB MOS output stage 400 (see FIG. 4). Like the embodiments described above, the class-AB MOS output stage 700 comprises inverting and non-inverting inputs INn and INp, NMOS and PMOS output transistors M1–M2 providing an output OUT at their common source connection, biased class-AB control circuits 702a–702b, a current mirror 704, differential amplifiers OTA1–OTA2, and bias generators REF1–REF2 producing voltage references VREFn and VREFp.

As shown in FIG. 7, the controlled current sources CCS1–CCS2 of the current source 704 are implemented by PMOS transistors M7–M8, respectively. Further, the differential amplifier OTA1 includes a current mirror 705 formed by PMOS transistors M17–M18, NMOS transistors M13–M14 having gates that serve as the respective inputs of the differential amplifier OTA1, a degeneration resistor R3 connected across the drains of the transistors M13–M14, and NMOS transistors M22–M23 coupled to the transistors M13–M14 in a folded cascode configuration. It is noted that the transistors M22–M23 are biased by a reference voltage VREFc. The differential amplifier OTA2 includes a current source 19, and PMOS transistors M15–M16 having gates that serve as the respective inputs of the differential amplifier OTA2. The differential amplifiers OTA1–OTA2 share current sources 17–18, which are disposed in the differential legs of the respective amplifiers. The differential output current produced by the differential amplifier OTA2 flows through the folded cascode comprising the transistors M13–M14 and M22–M23 to the current mirror 705, the output of which corresponds to the common single-ended output of the amplifiers OTA1–OTA2.

Figure 8:
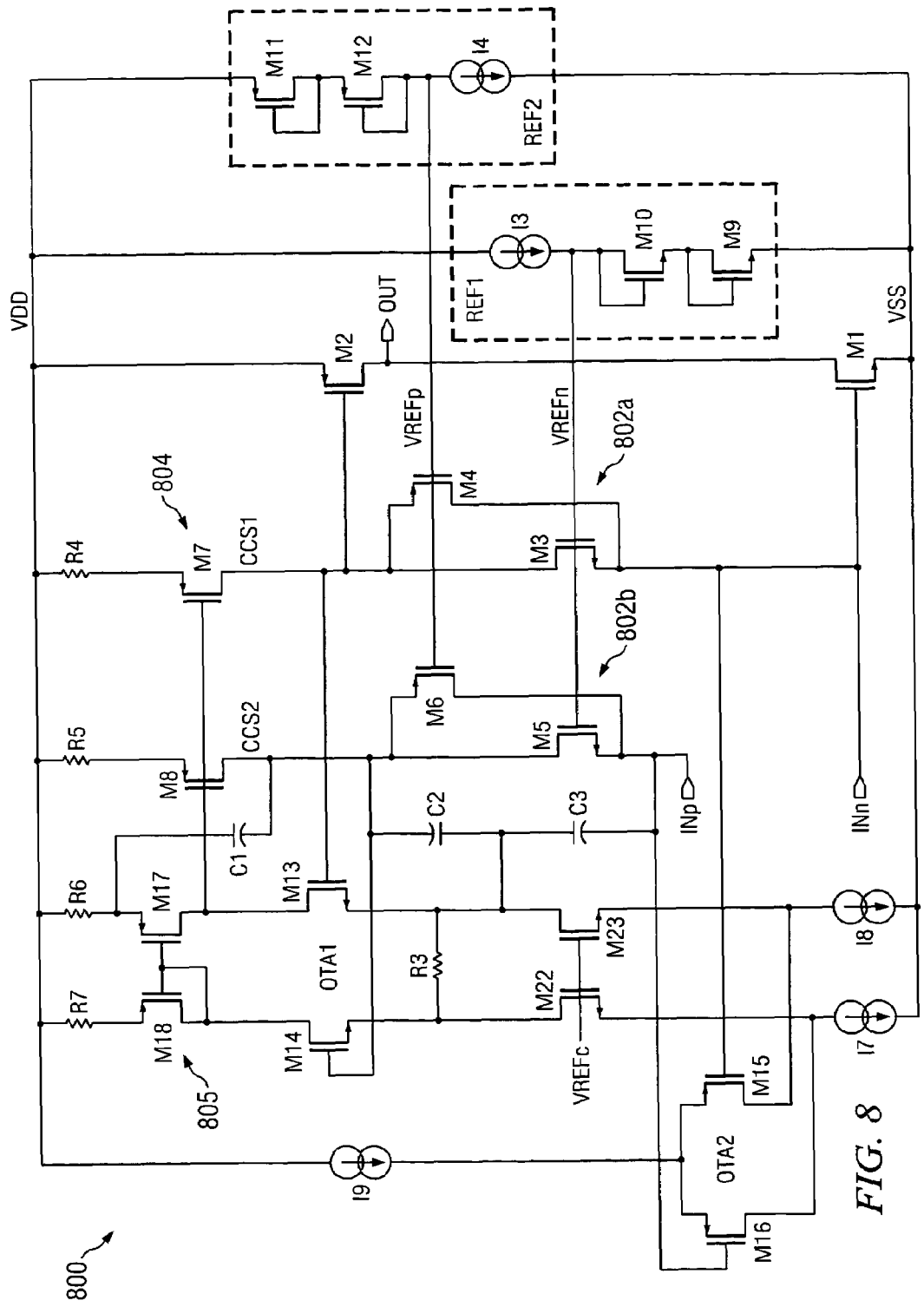
FIG. 8 is a schematic diagram of the class-AB MOS output stage of FIG. 7 modified to provide frequency compensation.

FIG. 8 depicts the preferred embodiment 800 of the class-AB MOS output stage 400 (see FIG. 4) with frequency compensation. Like the previously described embodiments, the class-AB MOS output stage 800 comprises inverting and non-inverting inputs INn and INp, NMOS and PMOS output transistors M1–M2 providing an output OUT at their common source connection, biased class-AB control circuits 802a–802b, a current mirror 804 including PMOS transistors M7–M8, differential amplifiers OTA1–OTA2, and bias generators REF1–REF2 producing voltage references VREFn and VREFp. The class-AB MOS output stage 800 further comprises degeneration resistors R4–R5 coupled between the drains of the PMOS transistors M7–M8 and the positive power supply VDD, respectively; degeneration resistors R6–R7 coupled between the drains of the PMOS transistors M17–M18 and the positive power supply VDD, respectively; a capacitor C1 coupled between the source of the transistor M8 and the drain of the transistor M17; and, capacitors C2–C3 serially coupled between the drain of the transistor M6 and the drain of the transistor M5, in which the common connection of the capacitors C2–C3 is connected to the source of the transistor M23. The resistors R4–R7 and the capacitors C1–C3 are operative to provide frequency compensation of the feedback path formed by the differential amplifier OTA1 including the transistors M13–M14, the differential amplifier OTA2 including the transistors M15–M16, and the current mirror 804 including the transistors M7–M8.

It will further be appreciated by those of ordinary skill in the art that modifications to and variations of the above-described output stage for high gain and low distortion operational amplifier may be made without departing from the inventive concepts disclosed herein. Accordingly, the invention should not be viewed as limited except as by the scope and spirit of the appended claims.

What is claimed is:

1. A class-AB output stage for an operational amplifier, comprising:
    first and second differential input signal lines;
    a first pair of complementary output transistors;
    a current mirror including first and second current sources;
    a first biased class-AB control circuit including a first pair of complementary control transistors, the first control circuit being connected in series between the first differential signal line and the first current source;
    a second biased class-AB control circuit including a second pair of complementary control transistors, the second control circuit being connected in series between the second differential signal line and the second current source; and
    a pair of differential amplifiers, each differential amplifier having first and second inputs and a current output, the respective outputs of the differential amplifiers being connected to a feedback signal line, the first inputs of the differential amplifiers being connected to respective gates of the first output transistors,
    wherein the first control circuit is connected between the respective first inputs of the differential amplifiers and the second control circuit is connected between the respective second inputs of the differential amplifiers, and
    wherein the feedback signal line is connected to the current mirror for reducing output conductance associated with the current mirror.

2. The class-AB output stage of claim 1 wherein the first and second class-AB control circuits each include first and second complementary control transistors, and further including first and second bias generators, an output of the first bias generator being connected to respective gates of the first control transistors, and an output of the second bias generator being connected to respective gates of the second control transistors.

3. The class-AB output stage of claim 2 wherein each one of the first and second bias generators includes a current source connected in series with a plurality of diode-connected bias transistors.

4. The class-AB output stage of claim 2 wherein each one of the first and second bias generators includes first and second current sources and first and second bias transistors, the first current source being connected in series with the first bias transistor, the second current source being connected in series with the second bias transistor, a gate of the first bias transistor being connected between the second current source and the second bias transistor, a gate of the second bias transistor being connected between the first current source and the first bias transistor at the output of the respective bias generator, thereby improving quiescent current stability over power supply voltage of the class-AB output stage.

5. The class-AB output stage of claim 1 further including a second pair of complementary output transistors, a source and a drain of a first one of the second output transistors being connected to a drain of a corresponding first one of the first output transistors, a gate of the first one of the second output transistors being connected to a source of a first one of the first control transistors, a source and a drain of a second one of the second output transistors being connected to a drain of a corresponding second one of the first output transistors, a gate of the second one of the second output transistors being connected to a source of a second one of the first control transistors, thereby reducing asymmetry caused by gate parasitic capacitance of the first output transistors.

6. The class-AB output stage of claim 5 further including a first resistive element coupled between the gate of the first one of the second output transistors and the source of the first one of the first control transistors, and a second resistive element coupled between the gate of the second one of the second output transistors and the source of the second one of the first control transistors.

7. The class-AB output stage of claim 1 wherein each transistor included therein is implemented in MOS technology.

8. The class-AB output stage of claim 1 wherein each transistor included therein is implemented in bipolar technology.

9. A method of biasing a class-AB output stage for an operational amplifier, comprising the steps of:
providing first and second differential input signal lines;
connecting a pair of complementary output transistors;
connecting first and second current sources to form a current mirror;
connecting a first class-AB control circuit in series between the first differential signal line and the first current source, the first control circuit including a first pair of complementary control transistors;
connecting a second class-AB control circuit in series between the second differential signal line and the second current source, the second control circuit including a second pair of complementary control transistors;
connecting respective current outputs of a pair of differential amplifiers to a feedback signal line, each differential amplifier having first and second inputs, and connecting the first inputs of the differential amplifiers to respective gates of the output transistors;
connecting the first control circuit between the respective first inputs of the differential amplifiers, and connecting the second control circuit between the respective second inputs of the differential amplifiers;
connecting the feedback signal line to the current mirror to reduce output conductance associated with the current mirror; and
biasing the first and second control circuits by at least one bias generator.

10. The method of claim 9 wherein the biasing step includes biasing the first and second control circuits by first and second bias generators, wherein the first and second control circuits each include first and second complementary control transistors, wherein an output of the first bias generator is connected to respective gates of the first control transistors, and an output of the second bias generator is connected to respective gates of the second control transistors.

11. The method of claim 10 wherein each one of the first and second bias generators includes a current source connected in series with a plurality of diode-connected bias transistors.

12. The method of claim 10 wherein each one of the first and second bias generators includes first and second current sources and first and second bias transistors, the first current source being connected in series with the first bias transistor, the second current source being connected in series with the second bias transistor, a gate of the first bias transistor being connected between the second current source and the second bias transistor, a gate of the second bias transistor being connected between the first current source and the first bias transistor at the output of the respective bias generator, thereby improving quiescent current stability over power supply voltage of the class-AB output stage.

13. The method of claim 9 wherein each transistor included in the output stage is implemented in MOS technology.

14. The method of claim 9 wherein each transistor included in the output stage is implemented in bipolar technology.

* * * * *